United States Patent
Adam et al.

(10) Patent No.: US 8,263,468 B2
(45) Date of Patent: Sep. 11, 2012

(54) THIN BODY SEMICONDUCTOR DEVICES

(75) Inventors: Thomas N. Adam, Slingerlands, NY (US); Kangguo Cheng, Guilderland, NY (US); Ali Khakifirooz, Slingerlands, NY (US); Alexander Reznicek, Slingerlands, NY (US); Devendra K. Sadana, Pleasantville, NY (US); Ghavam G. Shahidi, Pound Ridge, NY (US)

(73) Assignee: International Busienss Machines Corporation, Armonk, NY (US)

( * ) Notice: Subject to any disclaimer, the term of this patent is extended or adjusted under 35 U.S.C. 154(b) by 187 days.

(21) Appl. No.: 12/766,859

(22) Filed: Apr. 24, 2010

(65) Prior Publication Data

US 2011/0263104 A1    Oct. 27, 2011

(51) Int. Cl.
*H01L 21/336* (2006.01)
(52) U.S. Cl. ............... 438/300; 438/906; 257/E21.132
(58) Field of Classification Search .............. 438/909; 257/E21.132, E21.227
See application file for complete search history.

(56) References Cited

U.S. PATENT DOCUMENTS

| | | | | |
|---|---|---|---|---|
| 5,089,441 A | * | 2/1992 | Moslehi | 438/800 |
| 5,968,279 A | | 10/1999 | MacLeish | 134/1.2 |
| 6,313,042 B1 | | 11/2001 | Cohen | 438/734 |
| 2007/0181057 A1 | | 8/2007 | Lam | 117/92 |

* cited by examiner

*Primary Examiner* — Chandra Chaudhari
(74) *Attorney, Agent, or Firm* — George Sai-Halasz; Louis J. Percello

(57) ABSTRACT

A method for fabricating an FET device is disclosed. The method includes providing a body over an insulator, with the body having at least one surface adapted to host a device channel. Selecting the body to be Si, Ge, or their alloy mixtures. Choosing the body layer to be less than a critical thickness defined as the thickness where agglomeration may set in during a high temperature processing. Such critical thickness may be about 4 nm for a planar devices, and about 8 nm for a non-planar devices. The method further includes clearing surfaces of oxygen at low temperature, and forming a raised source/drain by selective epitaxy while using the cleared surfaces for seeding. After the clearing of the surfaces of oxygen, and before the selective epitaxy, oxygen exposure of the cleared surfaces is being prevented.

14 Claims, 4 Drawing Sheets

THIN BODY SEMICONDUCTOR DEVICES

BACKGROUND

The present invention relates to electronic devices. In particular, it relates to SOI FET devices with body thicknesses in the few nanometers range.

As FET (Field-Effect-Transistor) devices are being scaled down, the technology becomes more complex, and changes in device structures and new fabrication methods are needed to maintain the expected performance improvements from one successive device generation to the next. It is particular interest to make low resistivity ohmic contact to devices in the below 25 nm gate length range.

BRIEF SUMMARY

A method for fabricating an FET device is disclosed. The method includes providing a body over, and in direct contact with an insulator, with the body having at least one surface adapted to host a device channel. Selecting the body to be Si, Ge, or their alloy mixtures. Choosing the body layer to be less than a critical thickness defined as the thickness where agglomeration may set in during a high temperature processing. Such critical thickness may be about 4 nm for a planar devices, and about 8 nm for a non-planar devices. The method also involves clearing surfaces of oxygen at low temperature, and forming a raised source/drain by selective epitaxy using the cleared surfaces for seeding. The method further includes preventing oxygen exposure of the cleared surfaces after the clearing of the surfaces of oxygen and before the selective epitaxy.

BRIEF DESCRIPTION OF THE SEVERAL VIEWS OF THE DRAWINGS

These and other features of embodiments of the invention will become apparent from the accompanying detailed description and drawings, wherein.

DETAILED DESCRIPTION

Figure 1A:
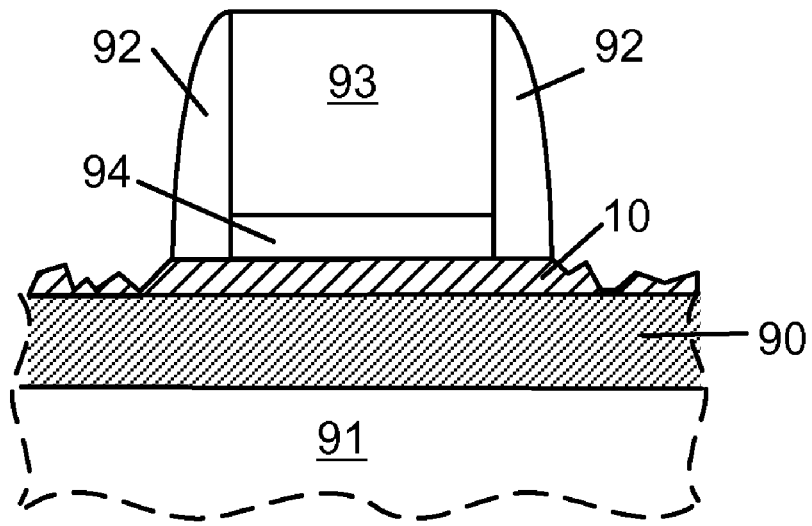
FIGS. 1A and 1B show prior art devices with pre-bake causing agglomeration of thin layers.

It is understood that FET (Field Effect Transistor) devices, often also referred as MOS devices, are well known in the electronic arts. Standard components of an FET are the source, the drain, the body in-between the source and the drain, and the gate. The gate is overlaying the body and is capable to induce a conducting channel on the surface of the body between the source and the drain. In the usual nomenclature, the body surface is adapted to host the channel. The gate is typically separated from the body by the gate insulator, or gate dielectric.

In general, FET devices may be planar devices, or non-planar devices. For planar FET devices the source, the drain, the channel are all associated with a single primary surface of a device body, which surface is without major curvatures or facets. The non-planar FET devices are three dimensional structures hosted by a fin structure. Hence, non-planar devices are often referred to in the art as FinFet devices. In FinFETs, the body of the transistor is formed in a fin rising out of a planar background, typically having both vertical and horizontal surfaces. The gate of the FinFet may engage the vertically oriented body side surfaces on both faces and a top surface, as well as. The latter non-planar FETs are often referred to as Tri-Gate devices.

Typically, the semiconductor material of an FET is the mainstay material of microelectronics, namely silicon (Si). However, embodiments of present disclosure include additional materials of importance in the microelectronics arts, such as germanium (Ge), and SiGe alloy mixtures.

It is known in the art that there are FET devices characterized as being semiconductor-on-insulator (SOI) FETs. Such devices are formed in a single crystal semiconductor material on top of an insulating layer. The insulating layer is typically a so called buried oxide layer (BOX), which, in turn, may be over a silicon wafer.

Microelectronics progress may be synonymous with decreasing feature sizes. The focus today is on the fabrication of FET devices with gate lengths of 25 nm, and less. The main candidates for reaching such short gate length FETs are SOI devices, either planar kind, or non-planar kind.

It is known from device scaling theory that for proper functioning, the device body hosting the channel may have to be scaled down in proportion to the gate length. It is expected that for planar SOI devices the body thickness may have to be about ⅓ to ¼ of the gate length. While for non-planar FET devices, such as FinFet and/or frigate, the body thickness may have to be ½ to ⅓ of the gate length. In general, the thinner the body hosting the channel, the better is the electrostatics, and thus the leakage current is lower.

It is known that one of the main challenges of thin body devices is to make low resistance electrical contact to the channel. Usual practice in the art has been to use raised source/drain, by epitaxially grow material to thicken the source and the drain regions of the device. (Henceforth, for simplicity, the terminology "source/drain" will be used, rather than "source and drain". However, whenever there may be a reason for differentiating between the source and the drain, for clarity, the source/drain abbreviated nomenclature will not be used.) The epitaxially thickened source/drain allows for better electrical contacting than the thin device body would allow by itself.

An epitaxial process works well only on clean, meaning primarily oxygen free, surfaces. During the device fabrication process, when the time arrives for processing the raised source/drain, the surfaces for epitaxy may not be sufficiently oxygen free. Consequently, clearing the oxygen from the surface by various chemical ways may have to take place. The term "chemical ways" in its present use may include a wide variety of cleaning processes, for instance, plasma techniques, as well. Finally, the last procedure ahead of the epitaxy itself, typically is a so called hydrogen baking procedure. This latter is may be needed to remove all oxygen, which may have been left behind by a chemical cleaning of the oxygen clearing, and which may have formed as so called native oxide by exposure to ambient environment before entering epitaxy equipment.

When standard hydrogen baking is performed on layers with a thickness less than a certain critical value, problems arise. The temperature of usual hydrogen baking is at least as high as 800° C., dictated primarily by the need to remove the native oxide.

The supposed stoichiometric composition of oxide is $SiO_2$. However, when dealing with layers that are very thin, maybe even below 1 nm, due to interfacial effects, and possible intermixing between various materials, the composition of any given material may not match exactly their supposed bulk composition. Therefore, to indicate the possibility of such thin layer effects, often the symbol "x" is used in chemical formulas giving the composition of very thin layers, for instance $SiO_x$. It is understood that the "x" in $SiO_x$, for instance, is close to, but not necessarily equal to 2. Any and all forms of oxide, and other oxygen compounds, may have to be removed from the surface which would serve as seed for the epitaxy.

The high temperature needed to sufficiently remove oxygen leads to agglomeration on structures with dimensions less the mentioned critical value. In particular, in FETs with thin body, the agglomeration occurs in the source/drain region, which results in consequent islanding and non-uniform epitaxial growth, or even complete loss of material in the source/drain. For a planar SOI structure, the critical thickness below which agglomeration occurs is about 4 nm. Consequently, it is assumed in the art that it is impossible to make reliable epitaxy, and hence contact, on devices with a body thickness of less than about 4 nm. For non-planar FET structures, due to 3-D nature the critical thickness value is even larger. Epitaxial growth, and hence reliably electrical contact, on non-planar FET structures with a body thickness of less than about 10 nm is becoming problematic, and below 8 nm it is essentially impossible.

If the body material contains Ge, such as SiGe, or if it is essentially Ge, the situation is worse because Ge is more susceptible to agglomeration. Thus, the need for high temperature bake in the surface preparation for epitaxial growth, appears to prevent further scaling FET devices to smaller dimensions.

Figure 1B:
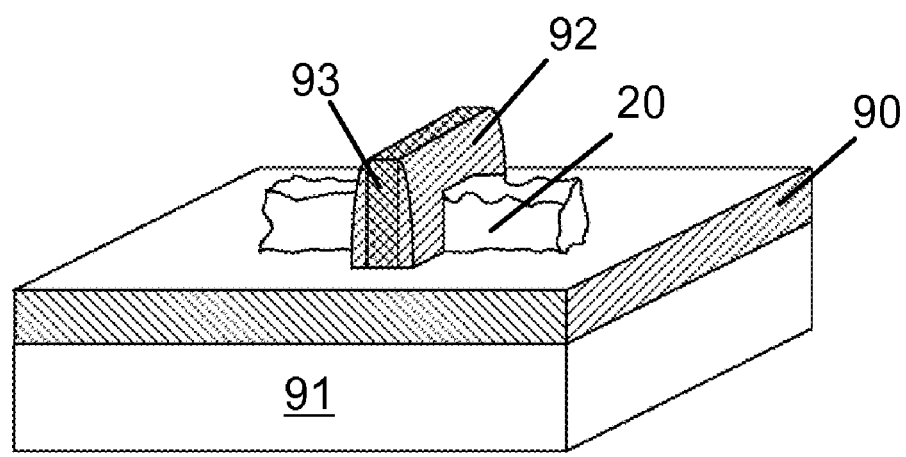

FIGS. 1A and 1B show prior art devices with standard pre-bake causing agglomeration of thin layers. A planar SOI FET is shown in FIG. 1A at the stage of fabrication immediately prior to the selective epitaxy for raising the source/drain. The device in fabricated over an insulating layer 90. The insulating layer, typically a buried oxide layer BOX, is supported by a wafer material 91, which typically may be Si. A device body layer 10 is over the insulator 90. A gate 93 is overlaying the region of the channel of the body 10, and typically a gate dielectric 94 separates the gate 93 and the channel region of the body 10. The figure also shows spacers 92, as they are standard building elements of advanced FET devices. As it is schematically illustrated, the region of the body of the source/drain is damaged in the form of agglomeration and material loss due to the high temperature baking process for preparing the surface for epitaxy. The critical thickness for planar FET SOI devices below which such agglomeration may make epitaxy practically impossible, is about 4 nm.

A similar prior art situation is schematically depicted for non-planar devices in FIG. 1B. Again, the device body 20 overlays an insulator 90, on a wafer 91. The gate 93 and the spacers 92 surround the body 20. The gate insulator, or the body in the channel region is not visible because of the device geometry. The device body thickness in the figure is below the critical thickness for non-planar FET SOI devices, which is about 8 nm. Again, the thin body in the source/drain region is damaged as a consequence of the high temperature pre-bake ahead of epitaxy. Such agglomeration may be clearly observed with the help of electron microscopy.

Embodiments of the present invention avoid the high temperatures used in the art when applying a hydrogen baking before epitaxial growth. In some embodiments the hydrogen baking is omitted altogether.

In embodiments of the present invention, when the device fabrication reaches the state for the selective epitaxial growth of source/drain, oxygen is cleared at a low temperature from the seeding surfaces. After the low temperature oxygen clearing, exposure to oxygen is prevented for the seeding surface before the selective epitaxy. In this manner hydrogen baking may be executed at a reduced temperature, or even eliminated. Since a seeding surface is not exposed to oxygen in between the oxygen clearing of and the epitaxial growth, it essentially does not form a native oxide. Depending on the effectiveness of the oxygen clearing procedure, a lower temperature hydrogen baking procedure is carried out, or hydrogen baking may be omitted.

Figure 2:
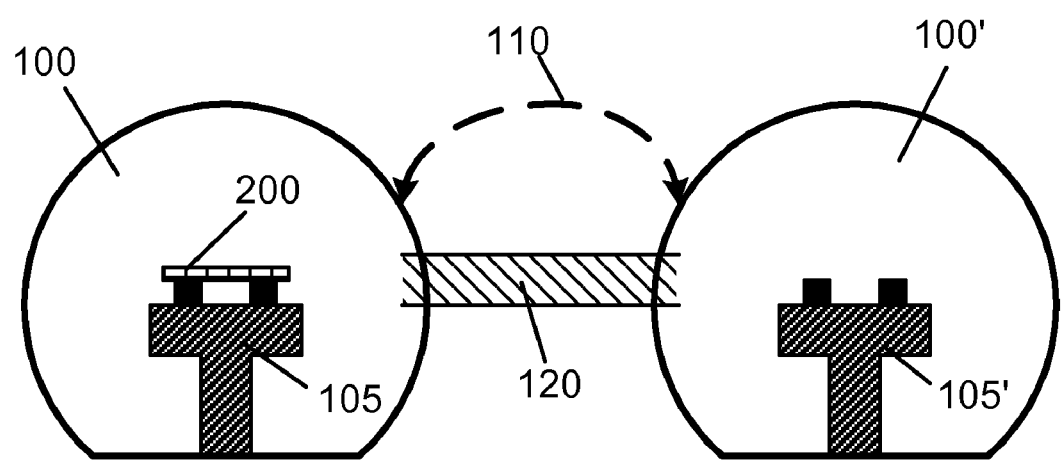
FIG. 2 shows symbolically ways of wafer processing for preparing and executing epitaxial growth.

FIG. 2 shows symbolically ways of wafer processing for preparing and executing epitaxial growth. The device being processed in usually part of an electronic chip. This is also displayed on various figures by wavy dashed line boundaries, for instance in FIG. 1A, or 3, and 4, indicating that the drawing typically may only be a small fraction of a whole circuit structure, such as for instance, an electronic chip. As it is well known in the art many chip together are processed on a wafer. Hence, one may discuss ways of wafer processing, even when the concern may be directed toward a particular device surface.

Manufacturing of FETs is very well established in the art. It is understood that there are a large number of steps involved in such processing, and each step might have practically endless variations known to those skilled in the art. It is further understood only those process steps will be detailed here that are of interest for embodiments of the present invention.

FIG. 2 illustratively shows a chamber 100 of an apparatus, where the ambient inside the chamber 100 is controllable. A wafer 200, containing the thin body FET device, is in position in a tool 105 for processing. Very briefly, and for illustrative purposes without intent of limiting, the wafer may have gone through the following fabrication before the state illustrated in FIG. 2. Device fabrication may start with providing a thin semiconductor on insulator substrate, such as Si on insulator, SiGe on insulator, or maybe Ge on insulator. Optionally the semiconductor layer may be thinned to the desired thickness by oxidation followed by removal of the oxide, or by etching processes, as known in the art. Usually device isolation is performed by methods such as, for instance trench isolation, or mesa isolation, or others. A gate dielectric and a gate stack is then fabricated. Sidewall spacer layers are then processed for the gate electrode. Source/drain extension doping and activation may follow. In an embodiment of the invention this is the stage illustrated in FIG. 2, where the surfaces may have to be cleaned, and cleared, of oxygen, and then to be followed by selective epitaxy over the source/drain region.

A low temperature clearing of oxygen in chamber 100 may follow methods known in the art. In an embodiment of the invention the clearing of oxygen my involve chemical cleaning, which term is meant to also include possible plasma enhancements for the chemical processes. Examples of such chemical cleaning, without limitation, may encompass the following. A plasma exposure that includes fluorine-containing species. Such fluorine-containing species may be ammonia ($NH_3$), nitrogen trifluoride ($NF_3$), ammonia fluoride ($NH_4F$), ammonium hydrogen fluoride ($NH_4F.HF$), ammonium hexafluorosilicate (($NH_4)_2SiF_6$), and possibly more.

After fluorine-containing species an atmosphere that scavenges fluorine may follow, possibly formed by plasma decomposition of a hydrogen-containing gas. Such chemical processes may collectively termed as low temperature because the cleaned surfaces are usually not exposed to temperatures of above about 400° C.

In an embodiment of the invention the clearing of oxygen my involve only heating the thin body layer to between about 700° C. and 850° C. under ultra high vacuum (UHV) conditions. The upper limit of the temperature range is limited by the likelihood that conglomeration of the thin body layer might occur, which may happen at or above about 850° C. The lower temperature limit of about 700° C. may be dictated by the length of time of the procedure. It is known in the art that $SiO_2$, and in general $SiO_x$, sublimates under UHV conditions. The temperature of 700° C. is sufficiently high for the sublimation to occur in time frames of minutes.

Following the described oxygen clearing procedures, the cleaned surfaces are prevented from oxygen exposure before the epitaxial deposition. Such prevention is symbolically illustrated in FIG. 2. It may be possible that the same chamber and tool that was used during oxygen clearing, are also suitable for carrying out the epitaxy. In such a case a second chamber 100' and tool 105' may not be needed, the epitaxy may be done "in-situ", as such a procedure is commonly referred to in the art. It is for this reason that the same indicator numbers, in primed fashion, are used, since the two shown chambers may in reality be one and the same. In alternate embodiments a different chamber 100' and tool 105' indeed might be used. In this case the wafer 200 would be transported between the two chambers 100 and 100'. It is possible that the two chambers are connected through appropriate paths 120 with various ambient locks, in a clustered fashion. Such cluster apparatuses are known in the art. It is also possible to transport 110 the wafer between two separate tools and still avoid oxygen exposure. One may place the wafer 200 in a locked container with vacuum capabilities, or having an inert ambient, such as, for instance, argon, nitrogen, helium inside the oxygen clearing chamber 100, and transport it over 110 to the chamber 100' and tool 105' suitable for epitaxy. In all cases the common factor is that oxygen exposure may not occur for the cleaned surfaces.

If needed, in embodiments of the present invention a hydrogen baking may take place after the oxygen clearing and before the actual start of the epitaxy. However, because of the already applied oxygen clearing, the temperature of the hydrogen bake may be reduced from where it causes agglomeration, and still complete the cleaning of the surfaces for effective seeding. For cases when the surface for epitaxial growth is essentially Si, the temperature of the hydrogen baking may be below about 850° C. In some embodiments the hydrogen bake, often referred to as "hydrogen pre-bake", of essentially Si surfaces may not exceed 800° C.

If the body surface is Ge, or high concentration SiGe, such as over 50% Ge, the maximum needed hydrogen baking temperatures may be significantly lower, never exceeding 600° C. When Ge is added to Si, the body layer becomes more susceptible to agglomeration, but at the same time the oxygen affinity of the surface is reduced with increasing Ge concentration, which in turn, requires lower temperature hydrogen baking.

Following the oxygen clearing procedures, and the possible reduced temperature hydrogen baking, the source/drain raised by selective epitaxy is carried out. The terms "epitaxial relation", "epitaxially", "epitaxy", "epi", "epitaxial growth" etc. carry their customary usage: meaning that a layer is formed on a crystalline surface, which layer has the same symmetry and crystalline orientation as the crystalline surface itself. Typically, a single crystal lattice structure carries across an interface. Customarily in epitaxy a single crystal, or monocrystalline, material forms a platform onto which another single crystal material with matching crystalline characteristics is deposited by one of several techniques known in the art. Such techniques include without limitation, for instance, molecular beam epitaxy (MBE), and various types of chemical vapor depositions (CVD). The term selective means the during the epitaxial deposition there may not be need for masking because growth occurs only the desired surfaces. In an embodiment of the invention the epitaxially deposited material matches the composition of the surface of the body. For instance, if the body is essentially Si, the epitaxially deposited material may be essentially Si, and if there is a Ge content at the surface, the epitaxially deposited material may match that Ge content. In an alternative embodiment of the invention the composition of the epitaxially deposited material is different from the composition of the surface of the body. For instance, if the body is essentially Si, the epitaxially deposited material may be SiGe.

Figure 3:
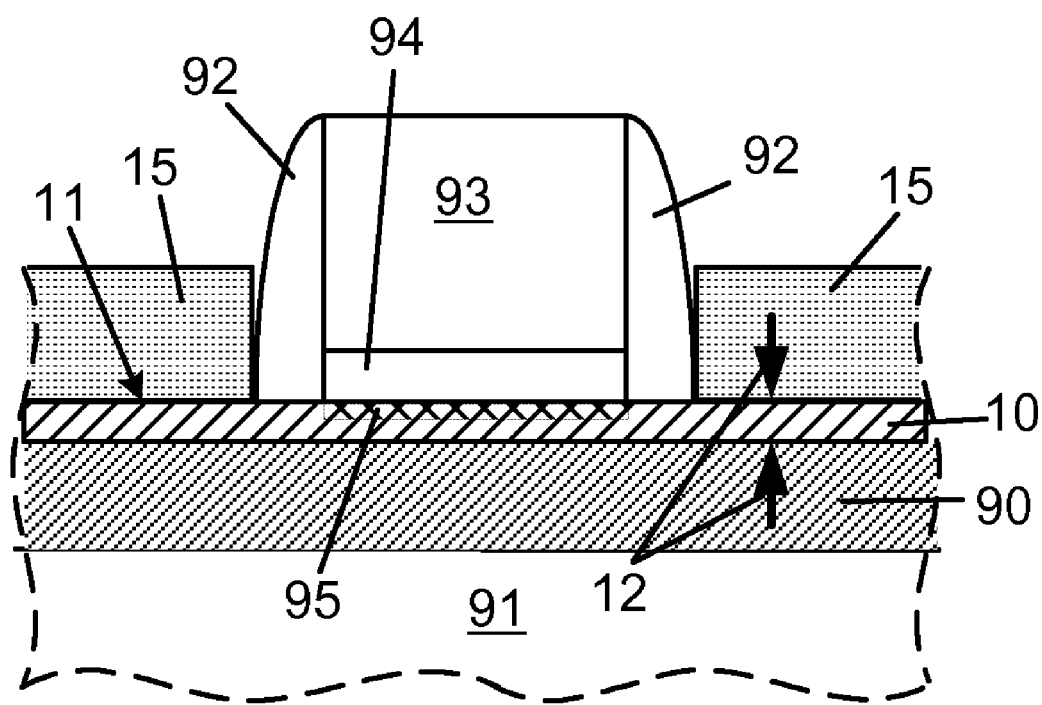
FIG. 3 shows a planar FET fabricated according to an embodiment of the disclosure.

FIG. 3 shows a planar FET fabricated according to an embodiment of the disclosure. A body layer 10 is provided over an insulator 90, such as a buried oxide layer (BOX). The body layer 10 is in direct contact with the insulator 90. The body layer has a primary surface 11 facing away from the insulator 90. The primary surface 11 is adapted to host the device channel 95. Elements and their indicator numbers not specifically mentioned are the same ones discussed in reference to FIG. 1A. The body layer may be composed of Si, Ge, and their alloy mixtures, with the possibility of additional dopants, and/or small, or trace, concentrations of further elements, such as for instance without the intent of limiting, carbon (C), nitrogen (N), fluorine (F).

The body layer 10 has a thickness 12 of less than about 4 nm. The thickness 12 is measured as the separation distance of the body layer 10 primary surface 11 from the insulator 90. Raised source/drain 15 are formed by selective epitaxy as discussed earlier. The epitaxy is seeded by the primary surface 11. Since, as discussed in reference to FIG. 2, the temperature the body layer experienced never exceeded values that would lead to agglomeration, the result is excellent quality epitaxial growth of the raised part of the source/drain 15.

Figure 4:
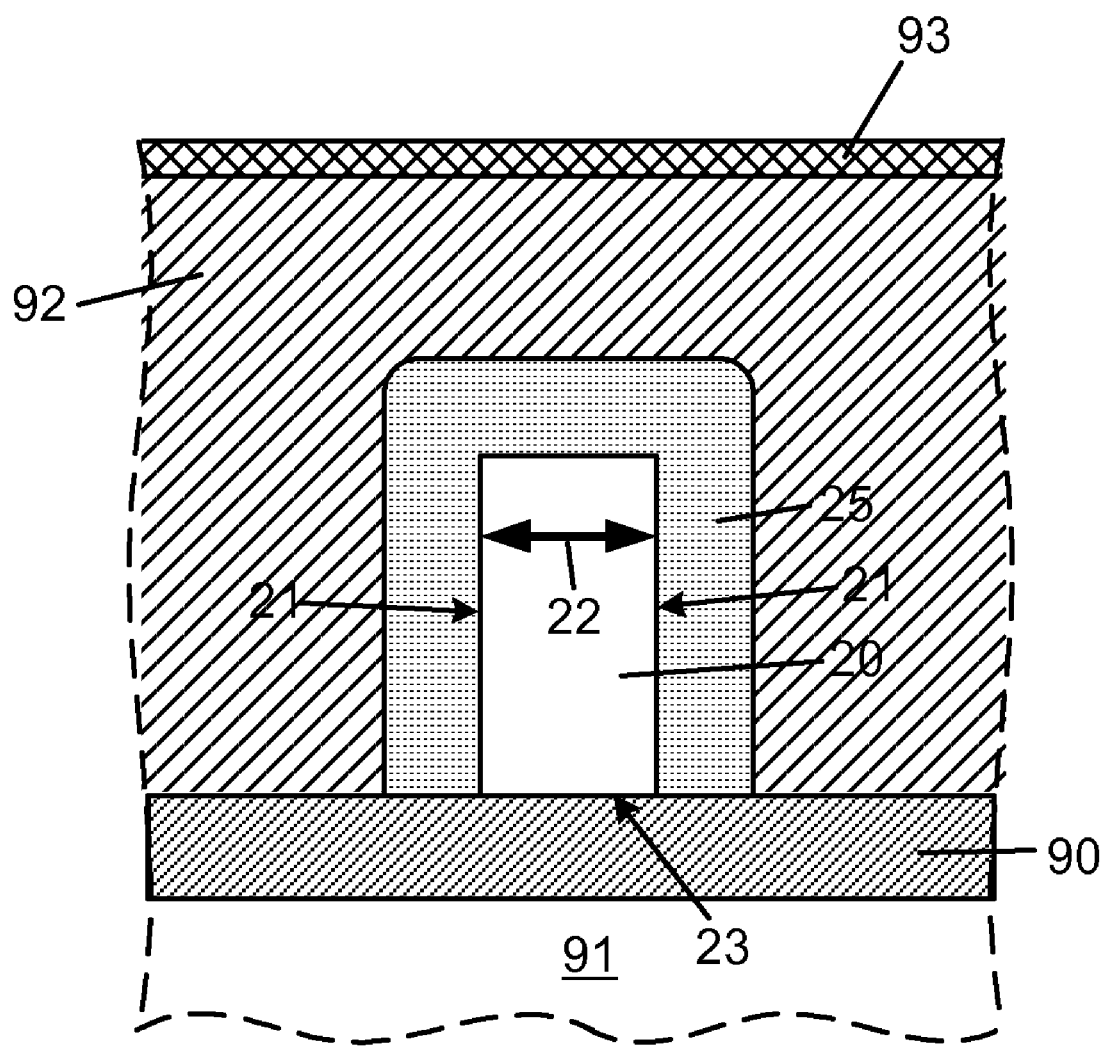
FIG. 4 shows a non-planar FET fabricated according to an embodiment of the disclosure.

FIG. 4 shows a non-planar FET fabricated according to an embodiment of the disclosure. A body 20 is provided over an insulator 90, such as a buried oxide layer (BOX). The body 20 is in direct contact with the insulator 90, and the body 20 and insulator 90 have a common interface 23. The body has surfaces, including two opposing side surfaces 21 parallel with one another, and each being substantially perpendicular to the interface 23 with the insulator 90. Each side surface 21 is capable to host a device channel, which channel is not visible in FIG. 2 because of the figure orientation, but one familiar with the art would know the channel location. Elements and their indicator numbers not specifically mentioned are the same ones discussed in reference to FIG. 1B. The body may be composed of Si, Ge, and their alloy mixtures, with the possibility of additional dopants, and/or trace concentrations of further elements, such as for instance without the intent of limiting, carbon (C), nitrogen (N), fluorine (F).

The body 20 has a thickness 22 of less than about 10 nm, but more likely less than about 8 nm. The thickness 22 is measured as the separation distance of the two side surfaces 21. The raised source/drain 25, shown in cross section in the present figure, is formed by selective epitaxy as discussed earlier. The epitaxy is seeded by the surfaces of the body, including the two side surfaces 21. Since, as discussed in reference to FIG. 2, the temperature the body experienced never exceeded values that would lead to agglomeration, the result is excellent quality epitaxial growth of the raised part of the source/drain 25.

Following the epitaxial growth of the source/drain, the FET device is fabricated to completion by known methods in the art.

Contact resistivity values measured on 3.5 nm thick SOI structures that were treated according to embodiments of the instant invention, had a lowered contact resistance by a factor of a 1000 in comparison to control samples that received the standard high temperature hydrogen baking.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

The foregoing specification also describes processing steps. It is understood that the sequence of such steps may vary in different embodiments from the order that they were detailed in the foregoing specification. Consequently, the ordering of processing steps in the claims, unless specifically stated, for instance, by adjectives as "before", "preceding", "ahead of", "after", and similar ones, does not imply or necessitate a fixed order of step sequence.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as "underneath", "top", "side", "over", "parallel", "perpendicular", etc., as used herein refer to relative location and orientation of various portions of the structures with respect to one another, and are not intended to suggest that any particular absolute orientation with respect to external objects is necessary or required.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

Many modifications and variations of the present invention are possible in light of the above teachings, and could be apparent for those skilled in the art. The scope of the invention is defined by the appended claims.

The invention claimed is:

1. A method for fabricating an FET device, said method comprising:
   providing a body layer over, and in direct contact with, an insulator, wherein said body layer has a primary surface facing away from said insulator, which primary surface is adapted to host a device channel;
   selecting said body layer of the group consisting of Si, Ge, and their alloy mixtures;
   wherein said body layer has a thickness, selecting said thickness to be below a critical thickness, wherein below said critical thickness said body is susceptible to agglomeration upon being heated above an agglomeration temperature, wherein said thickness separates said primary surface from said insulator;
   forming a raised source/drain by a selective epitaxy, and using said primary surface for seeding said selective epitaxy;
   ahead of said selective epitaxy, clearing said primary surface of oxygen, wherein said clearing consists of heating said body layer under ultra high vacuum (UHV) conditions to a temperature not exceeding said agglomeration temperature; and
   wherein said FET device comprises said body layer, said device channel, and said raised source/drain, and wherein said FET device is characterized as being a planar semiconductor on insulator (SOI) device.

2. The method of claim 1, wherein said method further comprises:
   selecting said body layer to be essentially of Si; and
   selecting said temperature not to exceed about 750° C.

3. The method of claim 2, wherein said method further comprises:
   after heating said body layer, performing said selective epitaxy without prior hydrogen baking of said body layer.

4. The method of claim 1, wherein said method further comprises:
   selecting said body layer to be a SiGe alloy mixture with at least 50% Ge concentration; and
   selecting said temperature not to exceed about 600° C.

5. The method of claim 4, wherein said method further comprises:
   after heating said body layer, performing said selective epitaxy without prior hydrogen baking of said body layer.

6. A method for fabricating an FET device, said method comprising:
   providing a body over, and in direct contact with, an insulator, wherein said body and said insulator have a common interface, wherein said body has surfaces, including two opposing side surfaces essentially parallel with one another, and with each said side surface being substantially perpendicular to said common interface, wherein each said side surface is adapted to host a device channel;
   selecting said body of the group consisting of Si, Ge, and their alloy mixtures;
   wherein said body has a thickness, selecting said thickness to be below a critical thickness, wherein below said critical thickness said body is susceptible to agglomeration upon being heated above an agglomeration temperature, wherein said thickness separates said two side surfaces;
   forming a raised source/drain by a selective epitaxy, using said surfaces of said body for seeding said selective epitaxy;
   ahead of said selective epitaxy, clearing said surfaces of oxygen, wherein said clearing consists of heating said body layer under ultra high vacuum (UHV) conditions to a temperature not exceeding said agglomeration temperature; and
   wherein said FET device comprises said body, said device channel, and said raised source/drain, and wherein said FET device is characterized as being a non-planar semiconductor on insulator (SOI) device.

7. The method of claim 6, wherein said method further comprises:
   selecting said body to be essentially of Si; and
   selecting said temperature not to exceed about 750° C.

8. The method of claim 7, wherein said method further comprises:
   after heating said body, performing said selective epitaxy without prior hydrogen baking of said body.

9. The method of claim 6, wherein said method further comprises:
- selecting said body to be a SiGe alloy mixture with at least 50% Ge concentration; and
- selecting said temperature not to exceed about 600° C.

10. The method of claim 9, wherein said method further comprises:
- after heating said body, performing said selective epitaxy without prior hydrogen baking of said body.

11. The method of claim 2, wherein said method further comprises:
- after clearing said primary surface of oxygen and preceding said selective epitaxy, hydrogen baking said body layer at temperatures not exceeding about 800° C.

12. The method of claim 4, wherein said method further comprises:
- after clearing said primary surface of oxygen and preceding said selective epitaxy, hydrogen baking said body layer at temperatures not exceeding about 600° C.

13. The method of claim 7, wherein said method further comprises:
- after clearing said surfaces of oxygen and preceding said selective epitaxy, hydrogen baking said body layer at temperatures not exceeding about 800° C.

14. The method of claim 9, wherein said method further comprises:
- after clearing said surfaces of oxygen and preceding said selective epitaxy, hydrogen baking said body layer at temperatures not exceeding about 600° C.

* * * * *